United States Patent
Grivna

(10) Patent No.: US 7,518,534 B2
(45) Date of Patent: Apr. 14, 2009

(54) 8-BIT TO 10-BIT ENCODING METHOD AND APPARATUS

(75) Inventor: Edward L. Grivna, Brooklyn Park, MN (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 11/880,163

(22) Filed: Jul. 20, 2007

(65) Prior Publication Data

US 2008/0024334 A1 Jan. 31, 2008

Related U.S. Application Data

(60) Provisional application No. 60/833,881, filed on Jul. 28, 2006.

(51) Int. Cl.
*H03M 7/00* (2006.01)
(52) U.S. Cl. .......................... 341/59; 341/50
(58) Field of Classification Search ............ 341/55, 341/58, 59, 95
See application file for complete search history.

(56) References Cited

U.S. PATENT DOCUMENTS

| | | | |
|---|---|---|---|
| 4,486,739 A * | 12/1984 | Franaszek et al. | 341/59 |
| 6,501,396 B1 | 12/2002 | Kryzak et al. | 341/59 |
| 6,911,922 B2 * | 6/2005 | Lund et al. | 341/65 |
| 7,205,911 B2 * | 4/2007 | Kim et al. | 341/58 |
| 7,259,699 B1 * | 8/2007 | Xue et al. | 341/59 |

OTHER PUBLICATIONS

Widmer et al, "A DC-Balanced, Partitioned-Block, 8B/10B Transmission Code", *IBM Journal of Research and Development*, vol. 27, No. 5, Sep. 1983, pp. 440-451.

* cited by examiner

*Primary Examiner*—Brian Young

(57) ABSTRACT

Methods and systems for generating 10-bit control codes for use in 8-bit to 10-bit encoding are disclosed. Such control codes can have low subblock disparity (where subblocks include 6-bit and 4-bit blocks), limited run lengths when concatenated, limited run lengths within sub-blocks, meet minimal allowable cumulative disparity values at predetermined bit locations (not violate a transition matrix), and not form an aliased comma character sequence within a code, or when codes are concatenated with other codes or encoded data values. Preferably, new codes are added to existing 8B10B schemes with less than sixteen control codes to arrive at a control code set of at least sixteen.

22 Claims, 5 Drawing Sheets

| Special Code Name | Current RD − abcdei fghj | Current RD + abcdei fghj |
|---|---|---|
| New19 | 110001 0111 | 001110 1000 |
| New25 | 010101 0111 | 101010 1000 |
| New28 | 101001 0111 | 010110 1000 |
| New31 | 011001 0111 | 100110 1000 |
| New34 | 100101 0111 | 011010 1000 |
|  |  |  |
| New16 | 001101 0111 | 110010 1000 |
| New20 | 001111 0001 | 110000 1110 |
| New14 | 001011 1110 | 110100 0001 |

FIG. 1

| Special Code Name | Current RD − abcdei fghj | Current RD + abcdei fghj |
|---|---|---|
| K28.0 | 001111 0100 | 110000 1011 |
| K28.1 | 001111 1001 | 110000 0110 |
| K28.2 | 001111 0101 | 110000 1010 |
| K28.3 | 001111 0011 | 110000 1100 |
| K28.4 | 001111 0010 | 110000 1101 |
| K28.5 | 001111 1010 | 110000 0101 |
| K28.6 | 001111 0110 | 110000 1001 |
| K28.7 | 001111 1000 | 110000 0111 |
| K23.7 | 111010 1000 | 000101 0111 |
| K27.7 | 110110 1000 | 001001 0111 |
| K29.7 | 101110 1000 | 010001 0111 |
| K30.7 | 011110 1000 | 100001 0111 |

FIG. 9 (BACKGROUND ART)

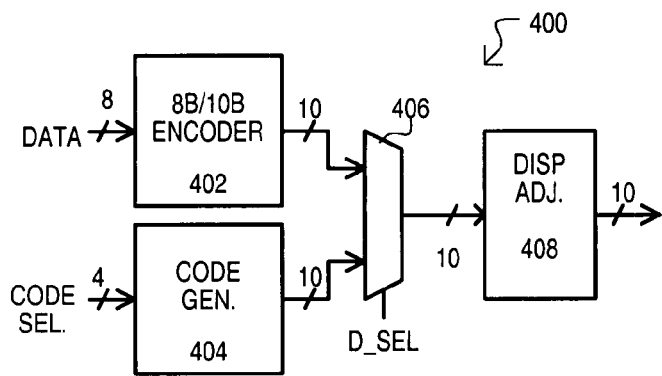
FIG. 4
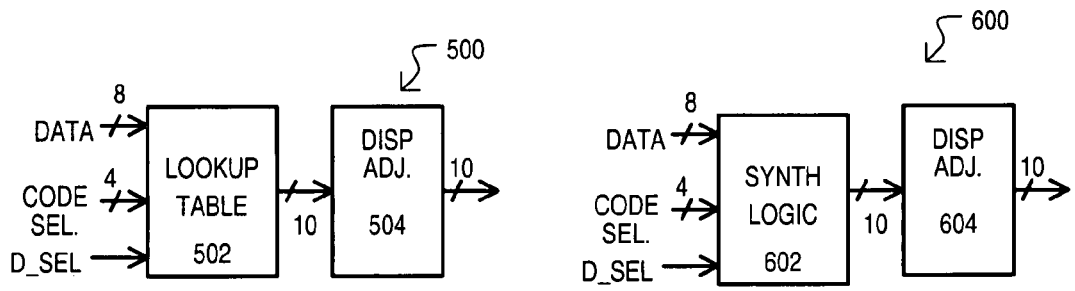
FIG. 5                FIG. 6
FIG. 7

| Unused Code Point | | | Unused Code Point | | | Unused Code Point | | |
| --- | --- | --- | --- | --- | --- | --- | --- | --- |
| # | Current RD− | Current RD+ | # | Current RD− | Current RD+ | # | Current RD− | Current RD+ |
| 1 | 1111001010+ | 0000110101− | 2 | 1111001001+ | 0000110110− | 3 | 1111001000− | 0000110111+ |
| 4 | 1111000110+ | 0000111001− | 5 | 1111000101+ | 0000111010− | 6 | 1111000100− | 0000111011+ |
| 8 | 1111000011+ | 0000111100− | 8 | 1111000010− | 0000111101+ | 9 | 1111000001− | 0000111110+ |
| 10 | 1110011000+ | 0001100111− | 11 | 1110000111+ | 0001111000− | 12 | 1101011000− | 0010100111+ |
| 13 | 1101000111+ | 0010111000− | 14 | 0010111000+ | 1101000111− | 15 | 1100111000− | 0011000111+ |
| 16 | 0011010111− | 1100101000+ | 17 | 1100101000+ | 0011010111− | 18 | 0011100111+ | 1100011000− |
| 19 | 1100010111+ | 0011101000− | 20 | 0011110001− | 1100001110+ | 21 | 1011011000− | 0100100111+ |
| 22 | 1011000111+ | 0100111000− | 23 | 0100111110+ | 1011000001− | 24 | 1010111000− | 0101000111+ |
| 25 | 0101010111+ | 1010101000− | 26 | 1010100111+ | 0101011000− | 27 | 0101101111+ | 1010010000− |
| 28 | 1010010111+ | 0101101000− | 29 | 0101111000+ | 1010000111− | 30 | 1001111000− | 0110000111+ |
| 31 | 0110010111+ | 1001101000− | 32 | 1001100111+ | 0110011000− | 33 | 0110100111+ | 1001011000− |
| 34 | 1001010111+ | 0110101000− | 35 | 0110111000+ | 1001000111− | 36 | 1000111110+ | 0111000001− |
| 37 | 0111000111+ | 1000111000− | 38 | 0111011000+ | 1000100111− | | | |

FIG. 10

8-BIT TO 10-BIT ENCODING METHOD AND APPARATUS

This application claims the benefit of U.S. Provisional Patent Application Ser. No. 60/833,881, filed Jul. 28, 2006, the contents of which are incorporated by reference herein.

TECHNICAL FIELD

The present invention relates generally to code values that are encoded into larger bit-encoded values for transmission, and more particularly to 8-bit code values that are encoded into 10-bit code values.

BACKGROUND OF THE INVENTION

Eight-bit to ten-bit (8B/10B) encoding remains a popular encoding type for a variety of applications. For example, such encoding is commonly used in serial type interfaces, including Enterprise System Connection (ESCON®) promulgated by International Business Machines Corporation, Fibre Channel, Gigabit Ethernet, and the Digital Video Broadcast/Asynchronous Serial Interface (DVB/ASI).

An 8B/10B encoding arrangement is shown in U.S. Pat. No. 4,486,739, issued to Franaszek et al. on Dec. 4, 1984 (hereinafter the '739 patent). In addition to providing encoding for the 256 possible 8-bit data values, the '739 patent shows the generation of twelve 10-bit "special characters" that can be used for synchronization and other control functions. For example, some special characters, referred to as containing a "comma" in the '739 patent, can serve to indicate 10-bit character boundaries. In the code of the '739 patent, comma characters are indicated by a first seven bit sequence of 0011111 (or the corresponding complement 1100000).

In this discussion, the bit positions of resulting 10-bit encoded data values and special characters can be designated by the letters abcdei fghj, where letters abcdei designate the first through sixth bit positions, while letters fghj designate the seventh through tenth bit positions.

All characters of the '739 patent meet a number of criteria, including a transition matrix and both an inter- and intra-character run length limitation (Dx.P7/Ky.A7 encoder rule). The transition matrix is shown in FIG. 2 of the '739 patent, and illustrates how an absolute disparity value remains below limits as each bit is transmitted. In particular, assuming a starting disparity is +1 or −1, the absolute disparity value after the first bit, third bit, fifth bit, seventh bit, or ninth bit is not greater than 2, after the second bit and fourth bit is not greater than 3, and after the sixth bit, eighth bit and tenth bit is not greater than one. The Dx.P7/Ky.A7 encoder rule prevents a run of the same bit type through positions 5 through 9.

Encoding data streams with the '739 can suffer from some drawbacks. In particular, one of the special characters "K28.7" (binary 1100000111) when concatenated with itself, or other characters, can result in an "aliased" comma character. An aliased comma character can be undesirable as it may be erroneously interpreted as a character or other data boundary.

Still further, the code of the '739 patent includes twelve control codes. Such a non-binary multiple can be more complicated to employ in many data transmission operations, such as data scrambling, as but one example.

A second conventional coding approach is shown in the IEEE Standard 1394b "High-Performance Serial Bus" (hereinafter IEEE 1394b). The IEEE 1394b standard includes a data mapping arrangement like that of the '739 patent but includes a new mapping arrangement for special characters, called control characters. The IEEE 1394b standard provides 16 control characters that can operate through scrambler functions (prior to encoding), with the sixteen code locations mapping to other locations within the same space. Such scrambling can lower radiated emission that can occur when a same character (or group thereof) is repetitively used to maintain a link (e.g., an idle sequence).

While the control characters of the IEEE 1394b standard can provide for easier scrambling than the twelve character set of the '739 patent, this set may have undesirable characteristics for some applications. In particular, the control codes of the IEEE 1394b standard may not meet criteria originally established for the earlier 8B/10B encoding arrangement of the '739 patent.

For example, the IEEE 1394b control codes (1) can include a run length greater than 5-bits both within codes and across concatenated codes; (2) can include a disparity within 6-bit/4-bit subblocks of the codes having an absolute value greater than 2; (3) can have a starting and ending disparity within 6-bit/4-bit subblocks not equal to −1 or +1; (4) can have a comma sequence (0011111 or 1100000) that occurs across character boundaries when characters are concatenated; (5) does not meet the transition matrix shown in the '739 patent, and (6) violates the Dx.P7/Ky.A7 rule, noted above.

It is additionally noted that the IEEE 1394b control codes can generate run lengths (i.e., a continuous sequence of same bit value) of 10 bits when concatenated. This is twice the 5-bit limit of the '739 patent. Such a large run length can make an AC coupled transmission path more difficult to design, and can require an increase in the passband of all components within the transmission path. Further, such a large run length can require a longer time constant for optical automatic gain control (AGC) circuits.

Another potential disadvantage of the IEEE 1394b control codes can be that they are not backward compatible with existing 8B/10B hardware. Further, due to the presence of aliased comma sequences, the use of such codes can require alternate framing hardware.

BRIEF DESCRIPTION OF THE DRAWINGS

FIG. 1 is a table illustrating 10-bit control codes according to embodiments of the present invention.

FIG. 4 is a block schematic diagram according to a third embodiment of the present invention.

FIG. 5 is a block schematic diagram according to a fourth embodiment of the present invention.

FIG. 6 is a block schematic diagram according to a fifth embodiment of the present invention.

FIG. 7 is a block schematic diagram according to a sixth embodiment of the present invention.

FIG. 9 is a table listing the complete set of special characters supported by the '739 patent.

FIG. 10 is a table listing all code points that pass the transition matrix of the '739 patent but are not indicated as being valid characters per the '739 patent.

DETAILED DESCRIPTION

Figure 2:
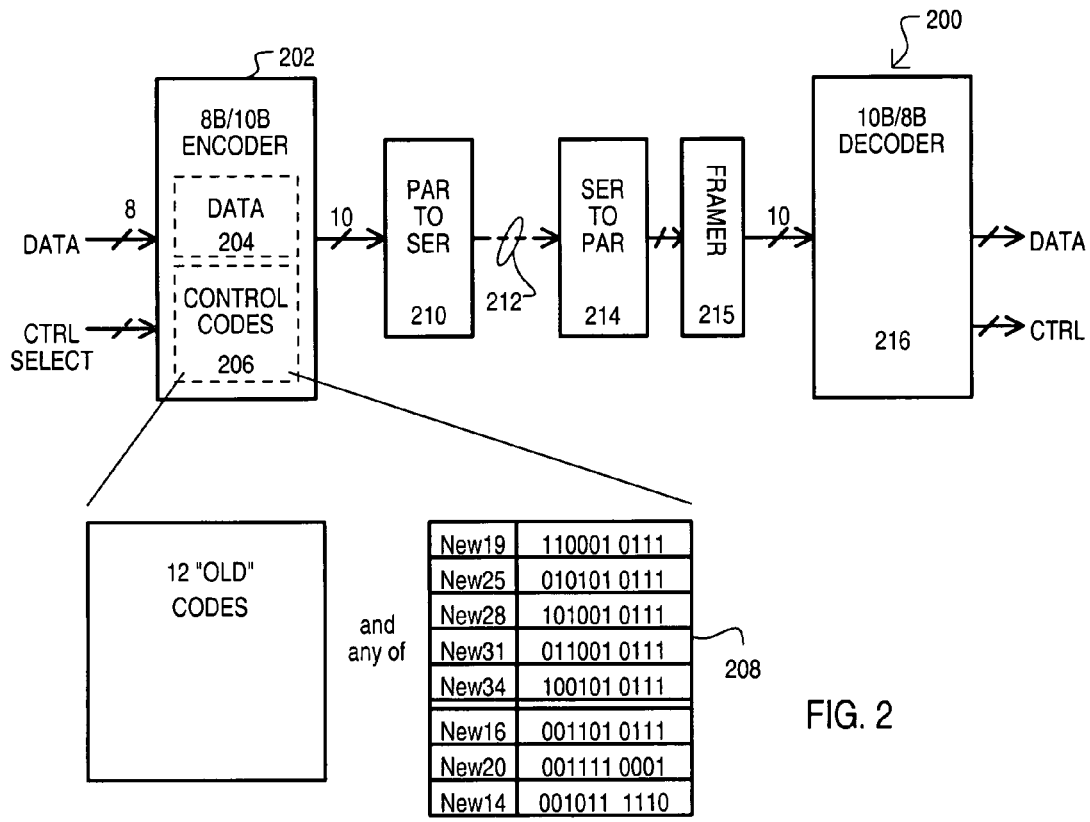
FIG. 2 is a block schematic diagram according to a first embodiment of the present invention.

Various embodiments of the present invention will now be described in detail with reference to a number of drawings.

The embodiments show methods and devices for 8-bit to 10-bit (8B/10B) encoding and/or 10B/8B decoding that can include a set of sixteen or more non-data characters (referred to herein as control codes). Such control codes can meet low disparity criteria of existing encoding schemes, while at the same time not result in aliased framing characters (e.g., comma character sequences). Such a control code set can also be backwards compatible with existing 8B/10B encoding schemes.

To better understand various features of the disclosed embodiments, existing control codes (e.g., special characters) will first be described. FIG. 9 shows control codes (special characters) according to existing 8B/10B encoding, like that of the '739 patent. Each 10-bit control code is given a name (left most column), and includes one value corresponding to a starting disparity of −1 (Current RD−) and a complementary value for a starting disparity of +1 (Current RD+).

According to the disclosed embodiments, an 8B/10B encoding method or device can provide 8B/10B encoding of data values that meet predetermined criteria, and in addition, can generate sixteen or more 10-bit control codes that meet the same criteria. Such criteria can include any or all of the following:

a) a subblock disparity of a first six bits (abcdei) and a last four bits (fghj) with an absolute value no greater than two;

b) not generate a run length greater than 5-bits within itself and when concatenated with itself or other 10-bit characters/codes;

c) not generate a run length within a first six bits (abcdei) greater than four;

d) not generate a run length within a last four bits (fghj) greater than three;

e) not violate the transition matrix shown in the '739 patent; and f) not violate the Dx.P7/Ky.A7 rule noted above.

In addition, or alternatively, a resulting 10-bit character code set can include one or more comma characters, indicated by a particular comma sequence of leading bits. Such a comma sequence may not be aliased within a character (i.e., start at a bit location other than a first bit location), or be formed by concatenation of the character with another character. In one particular arrangement, a comma sequence can be a first seven bit (abcdei f) sequence of 001111 1 (or its complement 110000 0).

To better understand various embodiments of the invention, possible 10-bit control code values will first be described. Referring to FIG. 10, a table shows all possible 10-bit code point pairs that have been determined to pass the transition matrix of the '739 patent, yet are not valid data or control code characters per the '739 patent. However, not all of this particular set of code point pairs meet all of the additional criteria noted above.

The code point pairs shown in FIG. 10 that pass the additional criteria have been identified to arrive at one particular example of possible 10-bit control codes according to an embodiment of the invention. This resulting set of control codes is shown in FIG. 1. These control codes will be referred to herein as "new" control codes. Embodiments according to the present invention can include one or more of the new control codes in addition to the twelve control codes shown in FIG. 9.

The new control codes of FIG. 1 include two groups: a first group includes codes identified as New19, New25, New28, New31 and New34. A second group includes the codes New16, New20, and New14 (it is noted that New14 violates the Dx.P7/Ky.A7 rule noted above, but otherwise meets the criteria). In referencing these codes, the label "NewXX" is used, where the value "XX" refers to the code point pair number shown in the table of FIG. 10. Codes of the first group can be considered a preferred group as all values meet all criteria a) through f), indicated above. In addition, the preferred group of 10-bit control codes does not include an aliased comma sequence 001111 1 (including its complement), nor do such control codes form such an aliased comma character when concatenated with other 10-bit codes of its group, with any of the data character codes in the '739 patent, or with the control codes of FIG. 9. Codes of the second group, except for New14, also meet all the listed criteria but may form an aliased comma when preceded by a K28.7 control code.

In this way, a group of sixteen control codes can be provided in an 8B/10B encoding arrangement that can meet various criteria of conventional 8B/10B data and control value encoding.

Codes of the second group, except for New14 which does not meet criterion f), can also meet all criteria of a) through f) noted above, and do not include an aliased comma sequence. However, the second group of codes can form an aliased comma sequence when immediately preceded by the value K28.7 of FIG. 9. However, in one particular embodiment, control code K28.7 can be excluded from used control codes and replaced by any of the new control codes. Even more particularly, control code K28.7 can be excluded as a control code, and five control codes from FIG. 1 can be added to the remaining 11 control codes of FIG. 9 to arrive at a set of sixteen control codes.

In arrangements that exclude control code K28.7, such a code value can still be applied for selected functions, such a link evaluation, due to the preferred bit sequence of the code (the bit sequence can present a lowest frequency pattern).

Of course, while some of the above arrangements arrive at a set of sixteen control code values formed by combining four or five of the control codes of FIG. 1 to those of FIG. 9, alternate embodiments can use fewer or greater numbers of the new control codes.

Having described code point pairs that meet all encoding rules for valid characters, but are declared as invalid per the '739 patent, various examples of systems using these new codes will now be described.

A system according to a first embodiment is shown in FIG. 2, and designated by the general reference numeral 200. A system 200 can include an 8B/10B encoder 202 that includes a data encoding section 204 and a control code generation section 206. A data encoding section 204 can receive 8-bit data values and provide 8-bit to 10-bit encoding, and preferably executes encoding according to the above conventional examples. More particularly, a data encoding section 204 can encode input data according to the rules described in the '739 patent.

A control code generation section 206 can receive one or more control select values CTRL SELECT, and in response thereto, generate any one of the new control codes 208 in addition to other preexisting control codes. Preferably, a control code generation section 206 can generate the twelve control codes of FIG. 9 along with four or more new control codes 208 to provide at least a selectable set of sixteen control codes.

In addition, or alternatively, a system 200 can further include a parallel-to-serial converter 210 that can convert a 10-bit parallel character into a 10-bit serial stream. Such serial data values can be transmitted over a link 212. A link 212 can include various transmission media including electrical cables, optical cables and/or a wireless connection, to name but a few. Of course, such 10-bit values can be subject to various data or signal processing operations prior to transmission.

FIG. 2 also shows a receiving end of a system 200, including a serial-to-parallel converter 212, a framer 215, and a 10B/8B decoder 216. 10-bit values received on link 212 can be subject to various data or signal processing operations and be received by a serial-to-parallel converter 212 that can convert 10-bit serial values into 10-bit parallel values. Framer 215 can frame a received character data stream into character boundaries. A 10B/8B decoder 216 can decode 10-bit values into corresponding 8-bit data values, or control values indicating a particular type of control code.

A control code generation section 206 can be separate from, or utilize circuitry of, a data generation section 204. That is, in some arrangements control codes, or portions of control codes, can be generated with the same circuits that encode 8-bit data values. In such cases, a data value can be input to generate a 10-bit control code along with one or more control select signals.

According the disclosed embodiments, various approaches can be utilized to generate the new 10-bit control codes.

Figure 3:
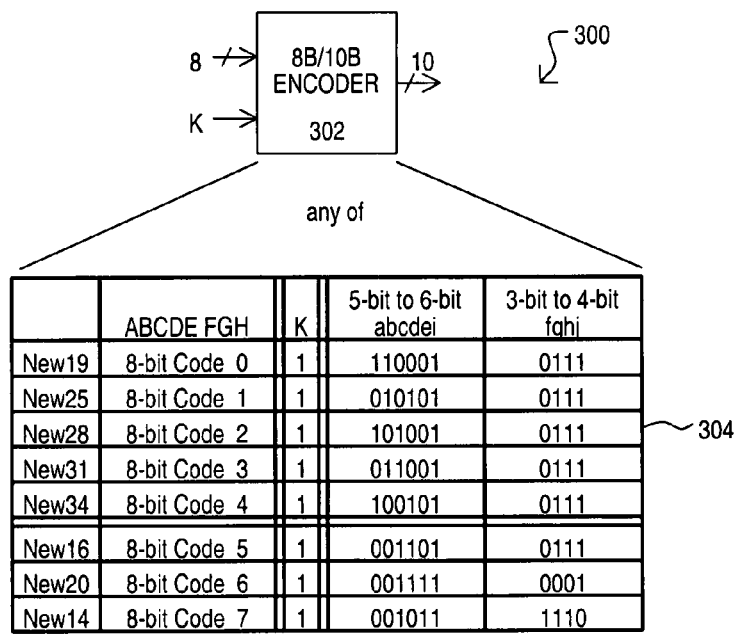
FIG. 3 is a block schematic diagram according to a second embodiment of the present invention.

FIG. 3 shows a second embodiment of the present invention 300. A second embodiment 300 can include an 8B/10B encoder 302. An 8B/10B encoder can utilize existing encoding arrangements, like those described above. FIG. 3 shows one possible way to generate new control code values. In response to particular 8-bit code input values, along with an active code control signal "K", 10-bit code values can be generated. Even further, such an encoding operation can include a 5-to-6 bit encoding operation and 3-to-4 bit encoding operation. It is noted that the "new" codes can include a same 3-to-4 bit encoding operation for all but the last two code values (codes New20 and New14).

In this way, existing encoding arrangements can be used to generate new codes according to one embodiment.

FIG. 4 shows a third embodiment of the present invention 400. A third embodiment 400 shows an arrangement in which generation of control codes can be (1) separate from 8B/10B encoding of data values and (2) can select control codes defined in a binary space (e.g., $2^N$ possible control codes, where N is an integer). In the very particular example shown, a system 400 can include an 8B/10B encoder 402, a code generator 404, a data/control code selector 406 and a disparity adjust circuit 408. An 8B/10B encoder 402 can encode 8-bit data values into 10-bit control code values according to conventional techniques.

A code generator 404 can generate a control code based on a code select value. In the particular example shown, a code generator can select from among sixteen possible control codes according to a 4-bit binary value. It is understood that among the sixteen control codes can be at least one new control code, and preferably at least 4 of the new control codes. Mapping possible code selects to a binary space may be advantageous for functions such as scrambling.

A data/code selector 406 can select from either an encoded data value from 8B/10B encoder 402 or a control code generated by code generator 404 based on a select value D_SEL. Disparity adjust circuit 408 can alter code values according to a running disparity value that can be maintained by disparity adjust circuit as each 10-bit value is received. FIGS. 5 and 6 show two possible examples of how control codes can be generated according to embodiments. FIG. 5 shows an embodiment 500 in which a look-up table (LUT) can be used to generate control codes and/or encoded data values. As is well understood, a LUT can store data values in a number of locations, each of which can be output according to a particular data value. FIG. 5 also includes a disparity adjust circuit 504 for altering bit values according to a running disparity RD. It is understood that a LUT can be utilized to generate both data and control code values (in which case it can receive data inputs in conjunction with code select inputs) or to generate only control codes (in which case it can receive code select inputs).

FIG. 6 illustrates how logic can be utilized to generate control codes and/or encoded data values. According to well understood techniques, a desired logic function can be defined (e.g., according to a hardware design language) to generate desired control codes and/or encoded data values according to input values. Such a function can then be synthesized into a hardware design according to well understood techniques. As in the case of FIG. 5, synthesized logic can be utilized to generate both data and control code values (in which case data inputs and code select inputs are included) or generate only control codes (in which case code select inputs may only be included). A resulting generated control code value (and possible data value) can be adjusted by disparity adjust circuit 604.

As noted above, eliminating code "001111 1000" (K28.7) from among selectable control codes can allow new control codes New16 and New20 to be utilized without risk of an aliased comma character sequence. However, it may be desirable to utilize such code K28.7 in other functions, such as link evaluation. FIG. 7 shows a system 700 in which codes are generated according to such techniques. A system 700 can include a code generator 702 that can generate 10-bit control codes (704) in a "normal" operation that can include any or all of the new control codes, but not generate control code K28.7. However, for link evaluation purposes, can also generate code K28.7, which can generate a low frequency signal when repeated. Thus, in an evaluation operation, code K28.7 can be generated by appropriate 8-bit input signals and activation of signal K.

In this way, code K28.7 can be excluded from the set of standard control codes and limited for use in link evaluation.

Other embodiments of the invention may have closer compatibility with existing encoding hardware. Existing conventional 8B/10B systems, like that of the '739 patent, can split encoding operations into two parallel paths, a 5-bit to 6-bit (5B/6B) encoding path and a 3-bit to 4-bit (3B/4B) encoding path. According to another embodiment, new control codes can be generated using such encoding paths. One such approach is shown in FIG. 8.

Figure 8:
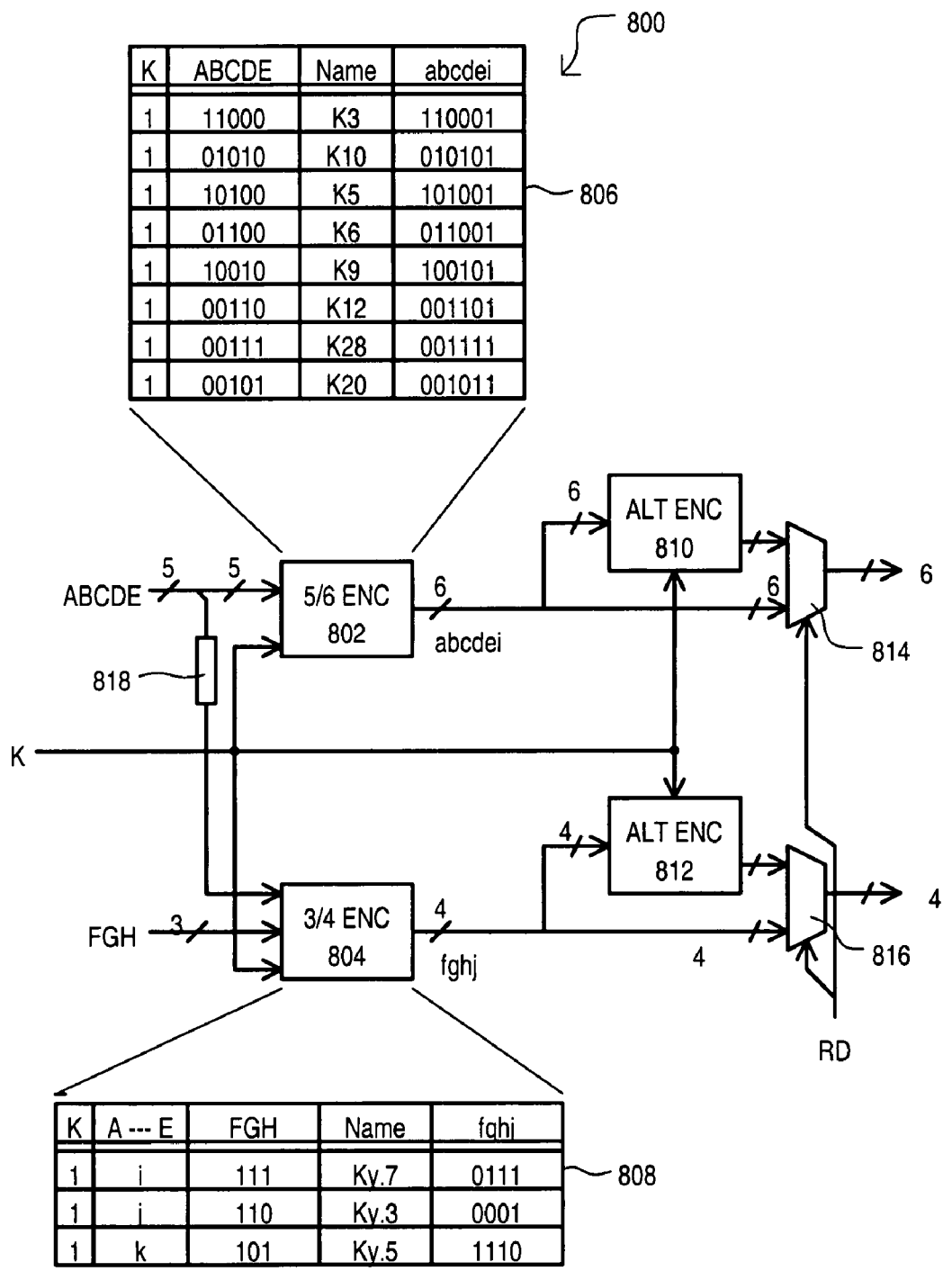
FIG. 8 is a block schematic diagram according to a seventh embodiment of the present invention.

FIG. 8 shows an 8B/10B encoder 800 that includes a 5B/6B encoder 802 and a 3B/4B encoder 804. Such encoders can be conventional in design, but unconventional in received input signals. Thus, FIG. 8 includes encoding function 806 that can generate a first six bits (abcdei) of each new 10-bit control code according to a five bit input value (ABCDE) and a control input K. It is noted that encoding function 806 does not necessarily generate a 6-bit encoded value by simply appending a "1" to a received 5-bit value. The encoding sequence can be much more complex. FIG. 8 also includes function 808 that can generate a last four bits (fghj) of each new 10-bit control code according to at least a 4-bit input value (FGH plus one or more of ABCDE) and a control input K. Thus, FIG. 8 shows a column "A-E" that provides values i, j, k to enable generation of four bit values based on these values in combination with FGH. As but a few examples, values i, j, k can be based on a single value selected from ABCDE, multiple values selected from ABCDE, or a logical combination of values selected ABCDE. FIG. 8 also shows cross encoding path 818 that can receive any of values ABCDE to generate values i, j, k.

To accommodate varying 10-bit code values in response to a running disparity RD, an encoder 800 can further include alternate 6-bit encoder 810 and alternate 4-bit encoder 812. Such alternate encoders (810 and 812) can receive control input K to provide different encoding based on the type of encoding being performed (data versus control character).

A 6-bit multiplexer (MUX) 814 can selectively output a 6-bit value from encoder 802 or alternate encoder 810 based on a running disparity value. Similarly, a 4-bit MUX 816 can selectively output a 4-bit value from encoder 804 or alternate encoder 812 based on a running disparity value.

In this way, generation of new control codes according to the embodiments can be compatible with existing 5B/6B and 3B/4B encoders.

It is understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A method of encoding data values with data codes and control codes, comprising the steps of:
   in response to each different eight bit data value, generating a corresponding 10-bit encoded data value, each 10-bit encoded data value having an absolute disparity value for all 10-bits of no more than 2; and
   in response to each of a plurality of control code select values, selecting a 10-bit control code from a set of at least sixteen 10-bit control codes, each 10-bit control code being different from the 10-bit encoded data values and having an absolute disparity value for all 10-bits of no more than 2, and an absolute disparity value for a first six bits of no more than 2, each 10-bit control code having particular bit values in response to a first running disparity value, and a complement of said bit values in response to a second running disparity value.

2. The method of claim 1, wherein:
   at least four of the at least sixteen 10-bit control codes each have a disparity value of zero for the first six bits.

3. The method of claim 2, wherein:
   the at least four of the at least sixteen 10-bit control codes each have an absolute disparity value of no more than 2 for the last four bits.

4. The method of claim 1, wherein:
   at least four of the at least sixteen 10-bit control codes each have a disparity value of 0 for the first six bits; and
   at least four of the at least sixteen 10-bit control codes each have an absolute disparity value of 2 for the last four bits.

5. The method of claim 1, wherein:
   the set of at least sixteen 10-bit control codes includes at least four 10-bit control codes selected from the group consisting of: 110001 0111, 010101 0111, 101001 0111, 011001 0111, 100101 0111, 001101 0111, 001111 0001, and 001011 1110 for a given running disparity value.

6. The method of claim 1, wherein:
   the set of at least sixteen 10-bit control codes includes at least two 10-bit control codes selected from the group consisting of: 110001 0111, 010101 0111, 101001 0111, 011001 0111, 100101 0111, 001101 0111 and 001111 0001 for a given running disparity value.

7. The method of claim 6, further including:
   the set of at least sixteen 10-bit control codes further includes at least one 10-bit control code selected from the group consisting of: 001101 0111, 001111 0001,and 001011 1110 for a given running disparity value.

8. The method of claim 1, wherein:
   the set of at least sixteen 10-bit control codes includes no more than three 10-bit comma control codes, at least one of which can indicate a boundary between encoded data values, each 10-bit comma control code including a predetermined sequence of seven bits starting with a first bit, and
   the remaining 10-bit control codes that are not comma control codes do not include the predetermined sequence of seven bits or their complements.

9. The method of claim 1, wherein:
   the set of at least sixteen 10-bit control codes includes no more than three 10-bit comma control codes at least one of which can indicate a boundary between encoded data values, each 10-bit comma control code including a predetermined sequence of seven bits starting with a first bit, and
   concatenating any of the remaining 10-bit control codes with another of the remaining 10-bit control codes or with any of the 10-bit encoded data bit values does not form the sequence of the seven leading bits.

10. The method of claim 1, wherein:
    none of the 10-bit encoded data values have identical bit values in the $5^{th}$ through $9^{th}$ bit positions; and
    none of the at least sixteen 10-bit control codes have identical bit values in the $5^{th}$ through $9^{th}$ bit positions.

11. The method of claim 1, wherein:
    the set of at least sixteen 10-bit control codes does not include the 10-bit control code 110000 0111.

12. The method of claim 1, wherein:
    the set of at least sixteen 10-bit control codes includes at least seventeen 10-bit control codes including 10-bit control code 110000 0111; and
    the 10-bit control code 110000 0111 is only utilized in communication link evaluation operations.

13. The method of claim 1, further including:
    transmitting each 10-bit encoded data value and 10-bit control code with a starting disparity value of −1 or +1; and
    during such transmission, an absolute running disparity value
       after the first bit, third bit, fifth bit, seventh bit, or ninth bit is not greater than 2,
       after the second bit and fourth bit is not greater than 3, and
       after the sixth bit, eighth bit and tenth bit is not greater than one.

14. The method of claim 1, wherein:
    concatenating any of the 10-bit encoded data values with one another or with any of the 10-bit control codes does not form a continuous sequence of the same bit for more than 5-bit positions; and
    concatenating any of the 10-bit control codes with one another or with any of the 10-bit encoded data values does not form a continuous sequence of the same bit for more than 5-bit positions.

15. An eight-bit to ten-bit encoding apparatus, comprising:
    an encoding section that encodes 8-bit input values into 10-bit encoded data values and control select values into any of at least sixteen 10-bit control codes, each 10-bit encoded data value having an absolute disparity value for all 10-bits of no more than 2, and each 10-bit control code having an absolute disparity value for all 10-bits of no more than 2, and an absolute disparity value for a first six bits of no more than 2.

16. The encoding apparatus of claim 15, wherein:

the sixteen 10-bit control codes includes at least four 10-bit control codes selected from the group consisting of: 110001 0111, 010101 0111, 101001 0111, 011001 0111, 100101 0111, 001101 0111, 001111 0001, and 001011 1110.

17. The encoding apparatus of claim 15, wherein:

the encoding section includes
- a data encoding section that encodes 8-bit data signals into the 10-bit encoded data values, and
- a control code generating section that generates 10-bit control codes in response to at least four code selection signals.

18. The encoding apparatus of claim 17, wherein:

the code generating section comprises a look-up table.

19. The encoding apparatus of claim 17, further including:

the code generating section does not generate a 10-bit code 110000 0111; and a link evaluation code generator that outputs the 10-bit code 110000 0111 or its complement in response to a link evaluation signal.

20. The encoding apparatus of claim 17, further including:

the data encoding section includes
- a 5-bit to 6-bit encoder that encodes a first five bits of each 8-bit input value into a 6-bit value, and
- a 3-bit to 4-bit encoder that generates 4-bit values in response to a last three bits of each 8-bit input value and at least one of the first five bits of the 8-bit input value.

21. The encoding apparatus of claim 20, wherein:

the control select values comprise eight bit input values and at least one control signal input;

the at least sixteen 10-bit control codes includes at least four 10-bit control codes selected from the group consisting of: 110001 0111, 010101 0111, 101001 0111, 011001 0111, 100101 0111, 001101 0111, 001111 0001, and 001011 1110 with their corresponding complements;

the 5-bit to 6-bit encoder encodes five bit values according to at least four of the following encoding operations to generate the at least four 10-bit control codes 11000 to 110001,
01010 to 010101,
10100 to 101001,
01100 to 011001,
10010 to 100101,
00110 to 001101, and
00111 to 001111.

22. The encoding apparatus of claim 21, wherein:

the 3-bit to 4-bit encoder encodes three bit values according to at least one of the following encoding operations to generate the at least four 10-bit control codes at least 111 to 0111, and
at least 110 to 0001.

* * * * *